(12) United States Patent
Takagi

(10) Patent No.: US 6,204,194 B1
(45) Date of Patent: Mar. 20, 2001

(54) METHOD AND APPARATUS FOR PRODUCING A SEMICONDUCTOR DEVICE

(75) Inventor: Mikio Takagi, Kawasaki (JP)

(73) Assignee: F.T.L. Co., Ltd., Kawasaki (JP)

( * ) Notice: Subject to any disclaimer, the term of this patent is extended or adjusted under 35 U.S.C. 154(b) by 0 days.

(21) Appl. No.: 09/231,821

(22) Filed: Jan. 15, 1999

(30) Foreign Application Priority Data

| Jan. 16, 1998 | (JP) | 10-006754 |
| Oct. 22, 1998 | (JP) | 10-301081 |
| Nov. 11, 1998 | (JP) | 10-320669 |

(51) Int. Cl.$^7$ .................................................. H01L 21/31

(52) U.S. Cl. ......................... 438/758; 438/765; 438/778; 438/782; 438/785

(58) Field of Search ................................ 118/715, 719, 118/717; 438/758, 765, 778, 785, 782

(56) References Cited

U.S. PATENT DOCUMENTS

| 5,116,784 | * | 5/1992 | Ushikawa | 437/255 |
| 5,618,349 | * | 4/1997 | Yuuki | 118/715 |
| 5,622,566 | * | 4/1997 | Hosaka et al. | 118/723 |
| 5,702,531 | * | 12/1997 | Mikata | 118/697 |
| 5,711,811 | * | 1/1998 | Suntola et al. | 118/711 |
| 5,968,593 | * | 10/1999 | Sakamoto et al. | 427/248.1 |

* cited by examiner

Primary Examiner—Matthew Smith
Assistant Examiner—Victor V. Yevsikov
(74) Attorney, Agent, or Firm—Armstrong, Westerman, Hattori, McLeland & Naughton, LLP

(57) ABSTRACT

The film growth speed of a conventional vertical heating method, such as $SiO_2$ film, polycrystalline Si film or the like of a semiconductor device, is enhanced by means of discharging and sucking the reaction gas onto and from the Si wafers placed horizontally in the vertical furnace. The wafers are rotated and the wafer-distance is set at 5 mm or more.

14 Claims, 10 Drawing Sheets

METHOD AND APPARATUS FOR PRODUCING A SEMICONDUCTOR DEVICE

BACKGROUND OF INVENTION

1. Field of Invention

The present invention relates to a method for producing a semiconductor device. The present invention aims to improve a conventional batch system, in which a plurality of semiconductor-silicon wafers are treated by chemical vapor deposition (CVD) or a direct reaction of the wafers with a reaction gas, so that the growth rate of the CVD films and the like is enhanced. The present invention also relates to an apparatus for producing a semiconductor device.

2. Description of Related Art

Long history is involved in the LP (low-pressure)-CVD methods using the hot-wall type heating furnace. A plurality of the semiconductor silicon wafers are located horizontally in the reaction tube which is installed in the furnace. The LP-CVD methods reported in the literature are related to the formation of $SiO_2$ film for example with the use of TEOS and ozone, PSG (phosphosilicate glass) film, BPSG (borophosopho-silicate glass) film, HTO (high-temperature oxidation) film with the use of SiH and $N_2O$ or NO, $Si_3N_4$ film, $Ta_2O_5$ film, $WSi_2$ film or the like.

In a conventional vertical hot-wall type heating furnace approximately 150 wafers can be treated in one batch. Although the treatment time is long in such a furnace, since the thermal stress can be mitigated, the above-mentioned furnace is advantageous for producing fine devices. Each wafer is or a plurality of wafers together are loaded into and unloaded from such a furnace by means of a fork-shaped wafer-loading and unloading jig.

In a vertical hot-wall type heating furnace from approximately 100 to 150 wafers are arranged with a clearance distance of 5–9 mm, and the arranged wafers are located in a temperature-equalizing zone, the length of which is from 700 to 900 mm. The internal pressure of such furnace is kept as low as possible, for example approximately 0.3 to 1.0 torr so as to attain uniform growth of the film on each wafer. The reaction gas is introduced into a furnace at a speed as high as approximately 3 to 7 m/second. The introduced reaction gas first flows along the peripheral edges of the wafers within a quartz reaction tube in a direction perpendicular to the surface of wafers. The reaction gas is then engulfed into a clearance between the wafer surfaces.

Under such low-pressure condition, the growth rate of films ranges from 20 to 100 angstroms/minute and is slow. The growth rate of a film in the LP-CVD is influenced by the pressure and also by the length of the temperature-equalizing region. The growth rate of a film varies greatly dependent upon the position of the wafers with increase in the length of the temperature-equalizing zone. This length and hence the treated number of the 6-inch wafers are limited to keep the variation of film thickness usually within a range of from 1 to 3%. Especially, the growth rate of an HTO film ranges from 15 to 20 angstroms/minute at 800° C. under the pressure of from 0.3 to 1.0 torr. Variation of the HTO film-thickness is from 3 to 6.5% on an 8-inch wafer and from 2 to 5% on a 6-inch wafer.

In the case of forming a P-doped or non-doped polycrystalline Si film with the use of $SiH_4$ under the LP-CVD conditions of: 5 to 7 mm of the wafer-distance; 625° C. of temperature; 200 mL/minute of the $SiH_4$ flow rate; 50 to 150 8-inch wafers; and 0.6 torr of pressure, the growth rate is from 50 to 80 angstroms/minute. This growth rate is considerably less than the growth rate of a polycrystalline Si by means of a conventional single-wafer process by means of the lamp heating, which is the so-called cold-wall process.

The total processing time of 150 wafers, including the temperature-elevating and lowering stages, ranges from approximately 120 to 600 minutes. The total processing time is greatly dependent upon the kind and thickness of the film to be formed. An example of the long total processing time, i.e., 600 minutes or more, is the formation of an approximately 1 $\mu$m thick amorphous Si.

As is described above, since the growth rate of a CVD film or a direct-reaction film is slow in the hot-wall process, its productivity can be enhanced by increasing the number of wafers treated in one batch, for example to 150 wafers.

SUMMARY OF INVENTION

It is an object of the present invention to provide an improved batch method for producing a semiconductor device, in which a CVD film or a direct-reaction film is formed at a high growth rate on a plurality of semiconductor silicon wafers.

It is another object to provide an apparatus for producing a semiconductor device, in which a CVD film or a direct-reaction film is formed at a high growth rate on a plurality of semiconductor-silicon wafers.

In accordance with the objects of the present invention, there is provided a method for producing a semiconductor device, in a heating furnace, in which a reaction tube is installed and a temperature-equalizing zone is formed in the reaction tube, comprising:

locating semiconductor-silicon wafers, preferably approximately seventy five or fewer wafers, in the temperature-equalizing zone horizontally and parallel to one another, thereby the surfaces of the semiconductor-silicon wafers are placed face to face;

introducing a reaction gas into the clearances between the semiconductor silicon wafers, thereby forming on said semiconductor-silicon wafers a CVD film or a direct reaction film;

said method further comprising:

setting the distance of said clearance at approximately 5 mm or more;

rotating said semiconductor-silicon wafers around an axis perpendicular to the wafer surface; and, discharging essentially all of the reaction gas from a first position in the proximity of the edges of the semiconductor-silicon wafers into each of said clearances.

The method according to the present invention may further comprise a step of sucking essentially all of the reaction gas discharged from the clearances between the semiconductor-silicon wafers, from a second positiion opposite to the first position.

The apparatus for producing a semiconductor device comprises:

a heating furnace;

a reaction tube installed in the heating furnace and including a temperature-equalizing zone;

a reaction zone formed in said temperature-equalizing zone and providing a space for forming a film on said semiconductor-silicon wafers, preferably approximately seventy-five or fewer wafers, by CVD or a direct reaction using a reaction gas;

a jig for holding a plurality of semiconductor-silicon wafers in the temperature-equalizing zone horizontally and parallel to one another and forming between the semiconductor silicon wafers a clearance of approximately 5 mm or more;

a driving means for rotating said semiconductor-silicon wafers around an axis perpendicular to the wafer surface;

a first gas-guiding means for guiding said reaction gas into the reaction tube in the proximity of the edges of the semiconductor-silicon wafers, while impeding contact of the reaction gas with an interior gas of the heating furnace; and, discharging ports of the first gas-guiding means, for discharaging essentially all of the reaction gas at the first position into each of said clearances.

The wafer-holding jig according to the present invention consists of a single monotlithic sheet having a holding portion(s) and a vacant space(s) formed by removing non-holding portion(s) of the single monolithic sheet. Alternatively, the wafer-holding jig according to the present invention comprises an outer annular portion and an inner annular portion and a joint portion connecting the outer and inner annular portions.

Preferably, the apparatus according to the present invention further comprises:

a second gas-guiding means for sucking essentially all of the reaction gas discharged from each of the clearances and guiding the reaction gas, while impeding its contact with the interior gas of the heating furnace;

sucking ports of the second gas-guiding means for sucking the reaction gas discharged from the clearances between the semiconductor silicon wafers; and, a gas-exhausting means connected to said second gas-guiding means.

The present invention is described in detail hereinafter.

First, the method according to the present invention is described.

(1) Heating Furnace

The so-called hot-wall type heating furnace is used.

A reaction tube, in which the temperature-equalizing zone is formed, is installed in the heating furnace. The reaction tube may be single or concentrically dual.

(2) Semiconductor Silicon Wafers

They are arranged parallel in the temperature-equalizing zone in such a manner that their surfaces are face to face. The number of semiconductor-silicon wafers (hereinafter referred to as "the wafers") is preferably approximately seventy five or fewer. The number of the wafers treated in one batch can be optionally determined such as five, thirteen and fifty depending upon the capacity of the jig which transfers the wafers between the respective steps of the process for producing the semiconductor devices. When the wafers treated in one batch exceed approximately seventy five, the temperature-equalizing zone becomes too long to attain good distribution of the film thickness, and the treating time is disadvantagesouly prolonged. In addition, when the distance between the wafers is very narrow, the temperature-elevation and lowering becomes slow. The distance between the wafers is, therefore, approximately 5 mm or more. The upper limit of such distance is determined by the appropriate length of the temperature-equalizing zone and is approximately 100 mm.

(3) Introduction and Withdrawal of Reaction Gas

In the conventional method, the reaction gas is discharged into the furnace altogether at high speed and is then engulfed into the clearance between the wafers (hereinafter referred to as "the inter-wafer clearance"). The reaction gas is then brought into contact with the entire surface of the wafers, followed by exclusion from the clearance. No means is provided for limiting the peripheral position of the gas-engulfment around the wafers. In such conventional method, the thickness of the film greatly varies depending upon the vertical position of the wafers. If an attempt is made to increase the gas pressure and hence the growth rate, the film-thickness variance is furthermore enlarged.

In the present invention, the introduction of reaction gas into the inter-wafer clearances is differentiated from the conventional method such that essentially all of the reaction gas is introduced from a particular position, i.e., the first position. This position is limited by using a first-guiding means which guides the reaction gas to any position around each wafer. The reaction gas is, then, discharged from the outlet ports of the conduit into the the inter-wafer clearances horizontally on the wafer surface. As a result, the growth rate can be exceedingly enhanced.

The gas-withdrawal method does not exert so great influence upon the growth rate of a film as the gas-introducing method does. The reaction gas can, therefore, be exhausted from an exhausting port provided on the top or bottom of a reaction tube, in the conventional method. This method of the present invention can attain satisfactory results when approximately twenty five or fewer wafers are to be treated in one batch.

Evidently, the peripheral position of gas discharging around the wafers is desirably limited, such that the second position is opposite the first position so that the reaction gas flows from the first to second position. The first and second positions as seen in the vertical direction should correspond to the respective inter-wafer clearances. More preferably, each gas-discharging port of the first gas-guiding means and each gas-sucking port of the second gas-guiding means should face each inter-wafer clearance. A conduit, a partition plate, a chamber and the like, which comprise the first and second gas-guiding means, should isolate their interior space from the interior space of the reaction tube, except that these spaces are communicated to one another through the gas-discharging and sucking ports. The pressure of the reaction gas in the conduit of the first gas-guiding means is preferably higher than the furnace-interior pressure. For example the former pressure is 1 atm. Such reaction gas having pressure of 1 atm can be discharged into the reaction tube and is then sucked by a pump or the like, which is secured at the end of the second gas-guiding means.

The proximity of a wafer, where the reaction gas is discharged from the first gas-guiding means or sucked into the second gas-guiding means, is neither the top nor bottom of a reaction tube in the conventional method, but is a position horizontally extended from the inter-wafer clearances. In addition, the first and second gas-guiding means should be close to the edge of a wafer such that the reaction gas discharged into or sucked from one of the inter-wafer clearances is not essentially mixed with reaction gas discharged into or sucked from other inter-wafer clearances neighboring the former clearance. A specific value of such distance can be known from the analysis by the software SOLVER (a software STREAM V2.9 of Cradle Corporation—three dimensional analytical program of heat flow using the finite element analytical method), in which the inter-wafer distance, gas flow-rate and pressure are input) and from installing this software into a computer (IRS 4D/indy, a product of Silicon Graphic Corporation).

In the present invention, the reaction gas can be guided by the first and second means, such as a conduit which is provided as a means separated from the furnace. The first and second means can also be a conduit or a chamber, a part of which is shared with the furnace.

The present invention is described hereinafter with regard to an embodiment, in which both the first and second positions are limited and the reaction gas is guided in the first and second gas-guiding means.

The reaction gas is guided upto the proximity of each inter-wafer clearance and is discharged into each inter-wafer clearance from a discharging port (first port) of the first gas-guiding means. The flow rate of the reaction gas can be made essentially uniform as seen in every inter-wafer clearance. The reaction gas is then introduced into and spreads in the inter-wafer clearance. In order to promote the gas spreading, the discharging ports and the edges of wafers are preferably as far as apart possible. Likewise, the total area of the discharging (first) ports is preferably less than the inner cross sectional area of a pipe conduit, while the total area of the sucking (second) ports is preferably less than the inner cross sectional area of a conduit.

In order to flow the reaction gas at an essentially uniformly flow rate into every inter-wafer clearance, the diameter of the first ports can be enlarged in the downstream direction of the gas, or the inner diameter of a gas-guiding conduit can be enlarged in the front side of the conduit. These methods neccessitate complicated adjustment of the port-diameter or the like. Preferably, two or more gas conduit-pipes, in which the reaction gas flows in opposite directions, are arranged longitudinaly and alongside one another in the reaction tube.

Alternatively, one pipe conduit bent into zigzag form is arranged longitudinally in a furnace.

The first and second gas-guiding means may have any cross sectional shape, such as circular, rectangular, semi-circular or the like. One or more discharging ports discharge the reaction gas into each inter-wafer clearance, and one or more discharging ports suck the reaction gas from each inter-wafer clearance.

In the case of two or more discharging ports for one inter-wafer clearance, they should be so separated as not to interfere with the reaction gas streams, before they enter the inter-wafer clearance.

In the present invention, the wafers can be locally held from the lower side by means of such projections as pins. A film is formed on the exposed portions of the supported lower surface of the wafers, that is, the surface, where no semiconductor devices are formed. This method is advantageous in the point that the stresses on the upper and lower films counteract one another to decrease distortion of the wafers.

(4) Rotation of Wafers

The wafers are rotated around the axis perpendicular to the surface thereof. As a result, the reaction gas is brought into contact with the entire surface of the wafers, so that the film thickness becomes uniform. Preferable rotation speed is from 5 to 60 rpm.

The method according to the present invention is characterized by the above items (1) through (4) and enables to set the pressure to be set at a high level appropriate for the high-speed growth, particularly from 1 to 40 torr. The measuring position of the gas pressure is, as in the conventional hot-wall type heating furnace, in a portion of the gas-exhausting conduit pipe directly proximal to the furnace.

The apparatus according to the present invention is now described. In this apparatus, the wide inter-wafer distance (2) and wafer rotation (4) as well as the jig described in the following item (5) are employed. In addition, the gas-introduction at a specified position (3) is limited as described in the following item (6).

(5) Wafer-holding Jig

The jig for holding the wafers is not manufactured by a conventional bonding method such as welding or bonding the parts. In the present invention, a single monolithic sheet is cut off by means of $CO_2$ laser, punching, etching and any other method to leave only the portions necessary for holding the wafer. When a jig is assembled by welding the parts, the flatness of the jig is impaired by thermal stress. On the contrary, a high level of the flatness is attained in the removal method. In addition to and/or instead of this method, the wafer-holding portion of a jig may consist of an outer annular portion, an annular inner portion and a joint portion connecting the outer and inner annular portions. Since the outer and inner annular portions support the respective portions of a wafer, the distortion of a wafer is minimized. A film is also formed on the non-supported and exposed portions of the lower side of the wafers. A film is, therefore, formed on the upper and lower surfaces, so that the distortion of a wafer can be minimized. When projections are to be formed on the inner and outer annular portions of the wafer-holding jig, the projections are bonded on the jig preferably by the diffusion welding method, particularly in a case of a 12-inch wafer, since the height of projections can be controlled to a uniform level by such welding method.

(6) Introducing and Exhausting Mechanism of Reaction Gas

The first gas-guiding means, preferably the first and second gas-guiding means are employed. In order to further spread the gas stream, the discharging port (first port) should be more distant from the wafers. This, however, leads to mixing of the gas streams, which are directed to the neighboring, upper and lower inter-wafer clearances, respectively. The following third and fourth gas-guiding means are preferably employed to avoid such mixing. The third gas-guiding means guides the gas stream from one of the first ports to one of the inter-wafer clearances facing said one port and impedes flowing of the gas stream to the inter-wafer clearances neighboring above and below said one inter-wafer clearance. The fourth gas-guiding means guides the gas stream from one of the inter-wafer clearances to one of the second ports facing said inter-wafer clearance and impedes the flow of the reaction gas to the second ports clearances neighboring above and below said one inter-wafer clearance. The third and fourth guiding means may be a partition plate which separates the space between the wafers and the first and second gas-guiding means into horizontal gas-flowing channels. Each third gas-guiding means or fourth gas-guiding means may be separate bodies or an integral body.

When the conventional jig is used to load a wafer on and unload the wafer from the wafer-holding jig having the structure as described hereinabove according to the present invention, the former jig abuts on the outer annular portion of the latter jig and cannot further advance. The loading and unloading of a wafer is, therefore, impossible. Therefore, the wafer-loading and unloading jig according to the present invention has a means for lifting a wafer above the wafer-holding jig, and a means for advancing below the lifted wafer and transferring the lifted wafer to and from the lifting means.

In an embodiment of the apparatus according to the present invention, the second gas-guiding means comprises a partition(s) for dividing the inner space thereof into at least two parallel channels, each having a gas-inlet and a gas-outlet, the width of which channel having a gas inlet at an upper position of the furnace is greater than the width of which channel having a gas inlet at a lower position of the furnace. The amounts of reaction gas sucked from the upper and lower positions of wafers can, therefore, be equalized.

In the temperature-elevating stage of wafers, the temperature becomes higher at the outer side of a wafer. In the temperature-lowering stage of wafers, the temperature becomes lower at the outer side of a wafer. The temperature-elevating speed from 500 to 900° C. in a vertical furnace, in which a hundred wafers are heat-treated in one batch, is reported to be from 5 to 10° C./minute at the highest. The temperature-lowering speed from 900 to 500° C. in the above-mentioned furnace, a hundred wafers are heat-treated in one batch, is reported to be from 2 to 3° C./minute at the highest. In the case of temperature-lowering, since the furnace body has such great heat capacity that the cooling of wafers is impeded, measures are taken for promoting the cooling. For example, ambient air is admitted into the clearance between the reaction tube and the furnace body. The cooling tubes are installed in the furnace so as to forcibly cool the furnace wall by water and the like.

FIG. 1 is a graph, the ordinate of which graph is the difference between the center and peripheral temperatures (only "temperature" is indicated in the drawing), and the abscissa of which is the time from the starting of rapid temperature-elevating from 500° C. The graph shows the measurement results of the temperature-difference on 8-inch and 12-inch wafers which are heated at high temperature-elevating speed of 30° C./minute. As is shown in FIG. 1, the temperature difference generated after 10 minutes is approximately 60° C. on the 12-inch wafer and approximately 30° C. on the 8 inch wafer.

Such temperature difference in the wafers accompanied by rapid temperature-elevating and lowering becomes greater as the diameter of wafers greater. In the case of large-diameter wafers 12 inches more in size, great strain and hence slip lines may be generated in the wafers even if the temperature difference is slight. The slip lines are more likely to generate in the cooling stage than the heating stage. Since the speed of temperature-elevating and lowering is limited from such point of view of the slip lines, the productivity level of a furnace remains low.

According to a preferable temperature-elevating method of the present invention for elevating the temperature up to 800° C. at the highest, the temperature-elevating step comprises:

rotating the semiconductor silicon wafers; and, discharging a gas, which is essentially non-reactive with the semiconductor silicon wafers and which has higher temperature than the semiconductor silicon wafers, from a position in the proximity of the edges of the semiconductor silicon wafers toward each semiconductor silicon wafer, when the temperature of the semiconductor-silicon wafers is 800° C. at the highest.

According to a preferable temperature-lowering method, in which the temperature is lowered from 800° C. at the highest, said temperature lowering step comprises:

rotating the semiconductor-silicon wafers; and, discharging a gas, which is essentially non-reactive with the semiconductor silicon wafers and which has lower temperature than the semiconductor silicon wafers, from a position in the proximity of the edges of the semiconductor silicon wafers toward each semiconductor silicon wafer, when the temperature of the semiconductor-silicon wafers is 800° C. at the highest.

Preferred embodiments of the present invention are hereinafter described with reference to drawings.

DESCRIPTION OF PREFERRED EMBODIMENTS

Figure 1:
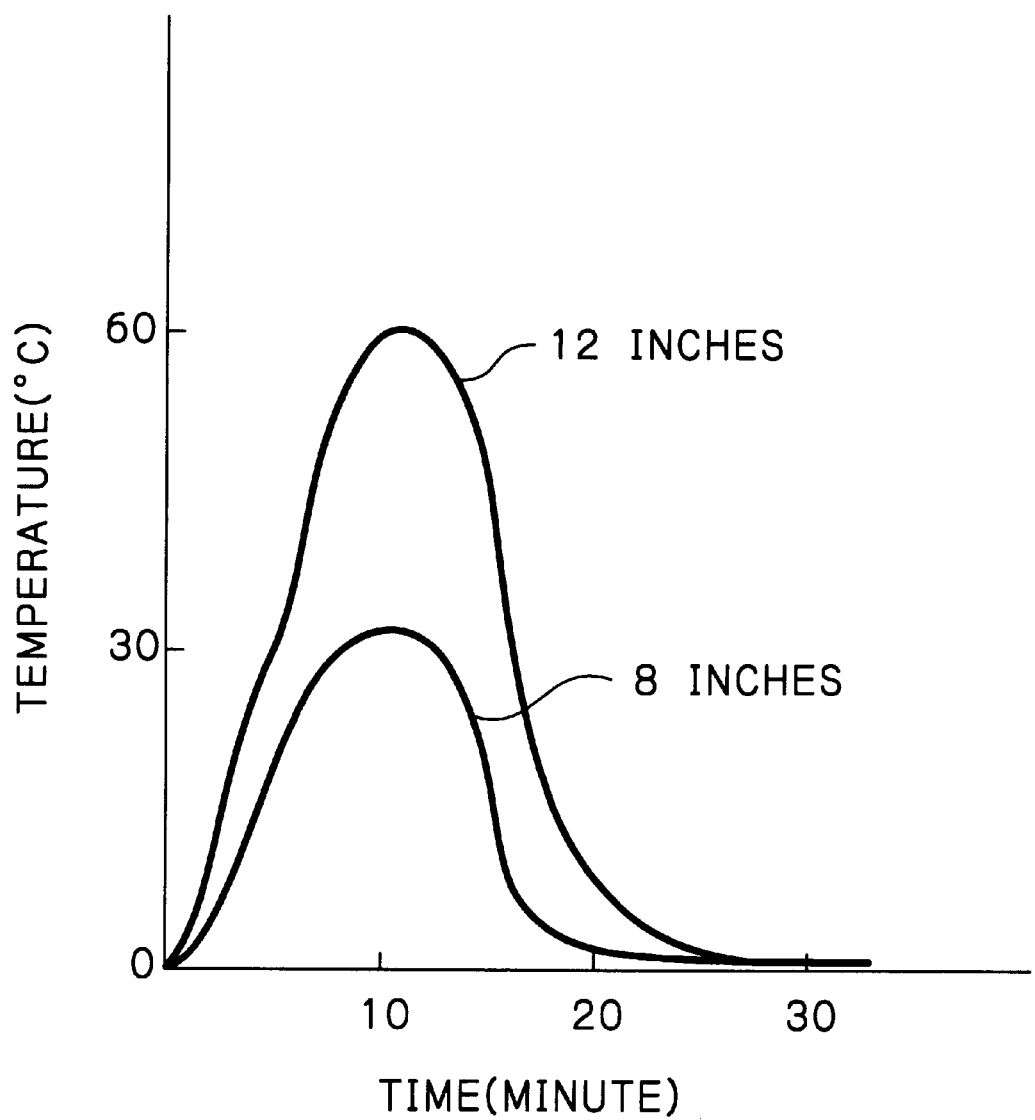
FIG. 1 shows the actually measured temperature difference on the surface of the 8 inch and 12 inch wafers, generated in the temperature-elevating stage.
Figure 2:
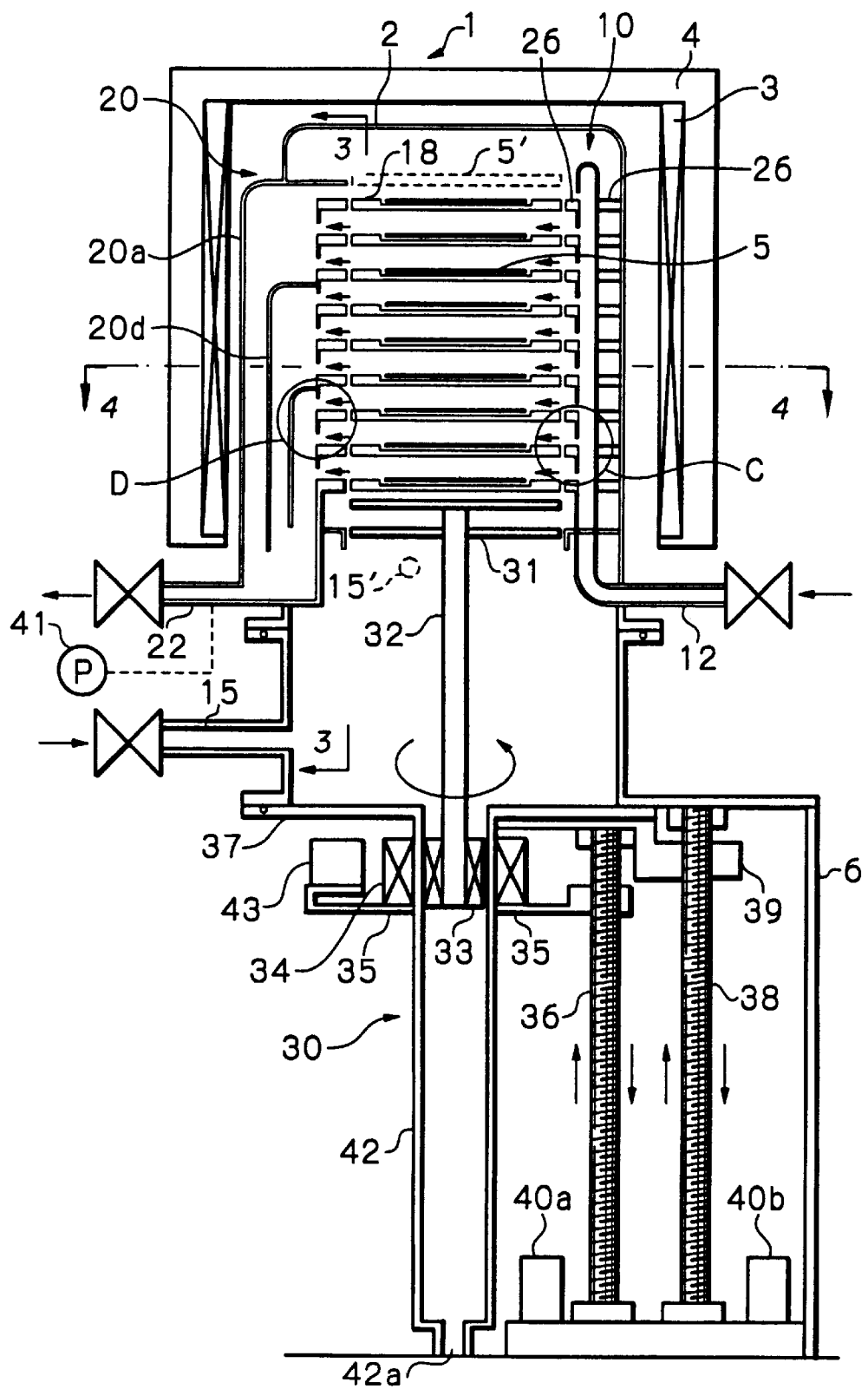
FIG. 2 is a cross-sectional view of the heating furnace according to an embodiment of the present invention.

Referring to FIG. 2, an embodiment of the apparatus according to the present invention is illustrated. This apparatus basically consists of the heating furnace 1 and the vertical wafer-conveying mechanism 30.

The reaction tube 2 is usually made of SiC, quartz and the like. The reaction tube is a tubular body, the top of which is closed and the bottom of which is open. Its upper portion is surrounded by the heater 3 which is rigidly secured to the furnace body 4 made of heat-insulating material. The heater 3 creates in the reaction tube 2 the temperature-equalizing region. The reaction tube 2, which is bent at its bottom in the L shape, is gas-tightly and removably fixed on the furnace bottom structure 37. The reaction tube 2 is also supported by the pedestal 6.

The wafers 5 are lifted, in the operation mode shown in FIG. 2, to the extreme upper position by means of the vertical wafer-conveying mechanism 30. The wafers 5 from 8 to 12 inches in diameter are piled in multi-stages, forming clearances therebetween with a distance of approximately 5 mm or more. The wafers 5 are heated to a predetermined temperature by the heater 3. Reference numeral 5' denotes a dummy wafer, the supporting member of which is not shown.

Figure 8:
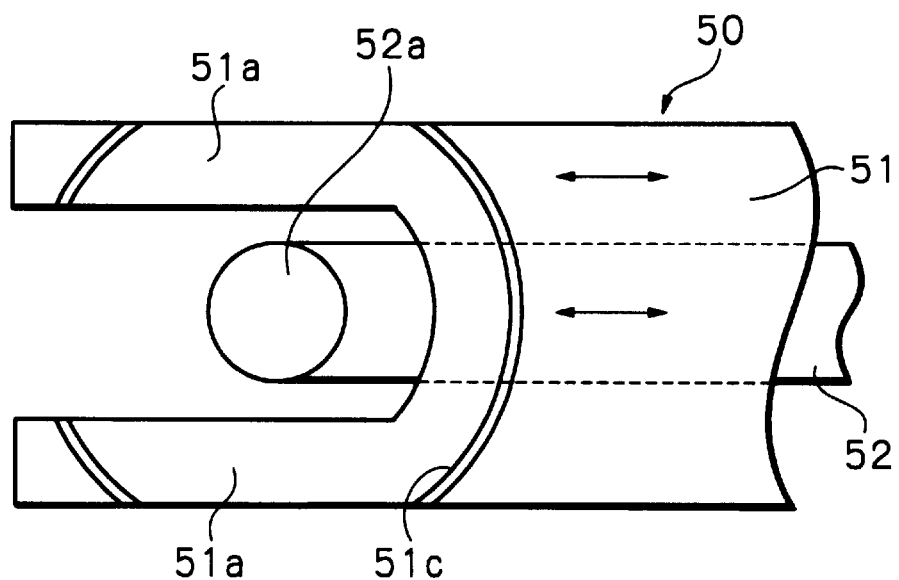
FIG. 8 is a plane view of the wafer-loading and unloading jig according to an embodiment of the present invention.
Figure 9:
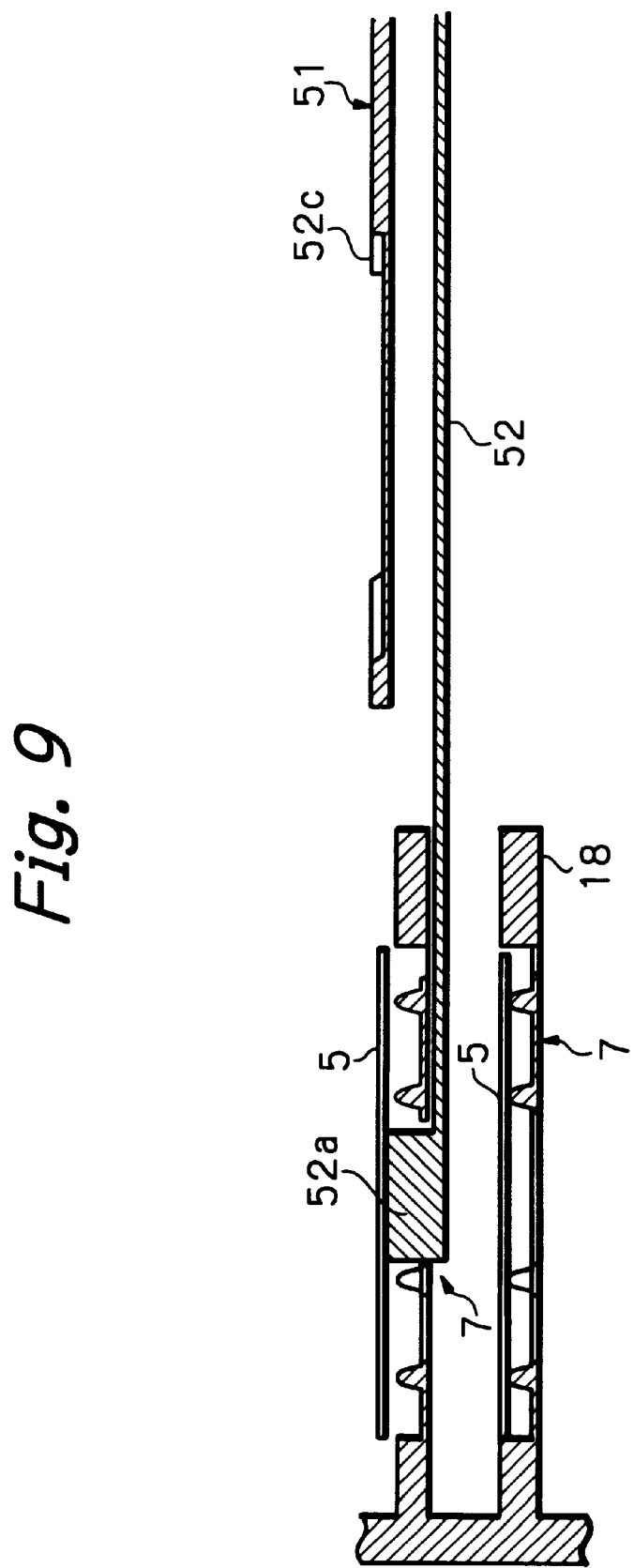
FIG. 9 illustrates the loading and unloading of a wafer.

The vertical wafer-conveying mechanism 30 comprises the rotary shaft 32 and the quartz boats 18 which are arranged in the form of shelves above the rotary shaft 32. The wafers 5 are therefore arranged vertically, forming a clearance between the upper and lower wafers 5. The separator 31 is secured to a position between the top and bottom of the rotary shaft 32 so as to heat-insulate the lower members such as 33 and 34. Such vertical wafer-conveying mechanism 30 is known for example in Japanese Unexamined Patent Publication (kokai) No. 9-17739 dated Jan. 17, 1997 (c.f. FIGS. 8 and 9). A magnet or coil 33 is attached to the lower end of the rotary shaft 32, while another vertically movable magnet or coil 34 exerts rotary force on the former magnet or coil 33. Therefore, the vertical wafer-conveying mechanism 30 can be vertically displaced, and the rotary shaft 32 is rotated. The magnet or coil 34 is supported by the plate 35 which is screwed on the rod 36. This rod 36 is rotated by the driving device 40a.

The tube 42 guides the vertical displacement of the rotary shaft 32. The top of tube 42 is integrally connected with the bottom structure 37 of the heating furnace. The bottom structure 37 is gas-tightly connected at the position shown in FIG. 2, with the reaction tube 2, during the treatment of wafers 5. Before and after the treatment, the rod 38, which is rotatably connected with the pedestal 6, is rotated by the driving device 40b. The joint portion 39 is rotably screwed on the rod 38 which is also rotably secured to the bottom structure 37. The joint portion can therefore be vertically displaced. Along with this movement, the bottom of the furnace is opened or closed. Purge gas, such as $N_2$ gas, in a minute amount can be fed from the inlet 42a through the interior of the tube 42.

The rod 36, the driving mechanism 40a, and the joint portion 41 are mechanisms for vertically displacing the plate 35. That is, when the rod 36 is rotated by the driving mechanism 40a, the plate 35, which is rotably screwed on the rod 36, slides on the tube 42 and is vertically displaced. The vertical position of the rotary shaft 32 is, therefore, adjusted.

The reaction gas is supplied from the main conduit 12 into the first gas-guiding means 10 and is distributed and discharged into every inter-wafer clearance by the first gas-guiding means 10. The second gas-guiding means 20 sucks the reaction gas from every inter-wafer clearance and is commnunicated with the exhausting conduit 22. This conduit 22 guides the reaction gas, while it is exhausted by a pump and is provided with the pressure-sensor 41. The discharging and sucking ports of the first and second gas-guiding means, respectively, face one of the inter-wafer clearances arranged vertically, as described hereinbelow. Therefore, the reaction gas is directly discharged into and exhausted from the inter-wafer clearances. As a result, laminar flow of the reaction gas can be realized in the furnace-interior space. Contrary to this, in the conventional method, when the upward or downward flowing reaction gas separates into streams into the inter-wafer clearances and streams still flowing downward or upward within the furnace-interior space, the former gas streams stagnate in the inter-wafer clearances. In addition, it is difficult to control the gas flow in the inter-wafer clearances. In the present invention, such stagnation is prevented and the gas flow in the respective inter-wafer clearances is possible.

Figure 3:
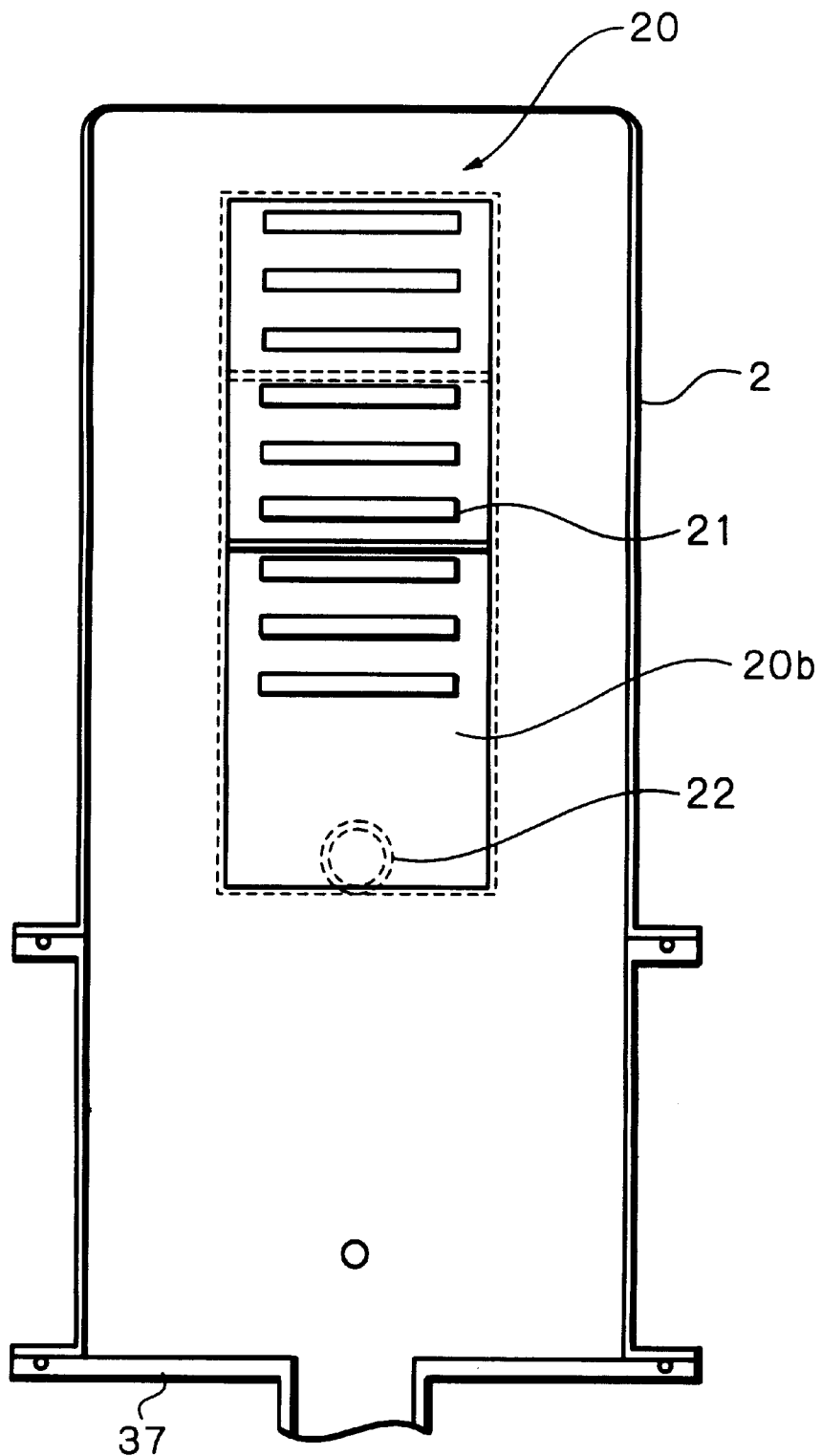
FIG. 3 is a cross-sectional drawing of FIG. 2 along the 3—3 line.

The second gas-guiding means 20 is provided with wide sucking ports 21 (FIG. 3) as much as the number of the inter-wafer clearances. The sucking ports 21 are preferably as wide as possible so as to suck the reaction gas, which has been spread over the entire surface of the wafers 5 and avoid mixing the upper and lower reaction-gas streams. The sucking ports 21 are preferably from 0.5 to 1.5 mm thick.

Figure 4:
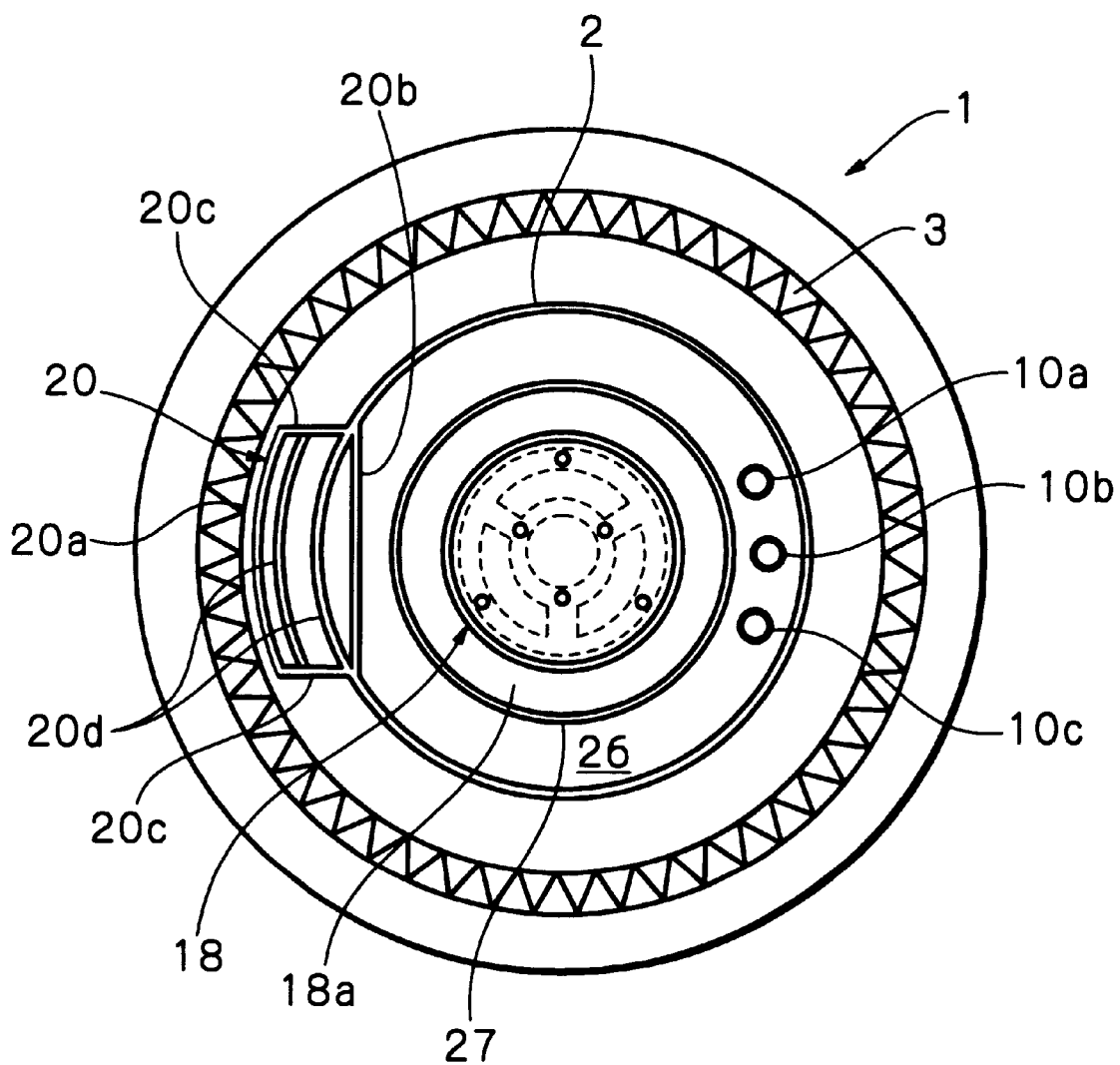
FIG. 4 is a cross-sectional drawing of FIG. 2 along the 4—4 line.

Referring to FIG. 4, which is a cross sectional view along the line 4—4 of FIG. 2, it is seen that the first gas-guiding means 10 consists of three conduits 10a, 10b, 10c which are branched from the common main conduit 12 (not shown). In the case of CVD using three kind of reaction gases, if the three kind of reaction gases are guided through one conduit, these gases react with one another before discharging into the furnace-interior space. The total area of the discharging ports of the first gas-guiding means 10 is preferably not more than the cross-sectional area of the main conduit 12.

The second gas-guiding means 20 is located at a diametrically opposite position of the first gas-guiding means 10, while the central axis of the wafers 5 is positioned at the center of the first and second gas-guiding means. A line, which connects the conduit 10a, the center of wafers and the second gas-guiding means 20, can therefore be drawn. The second gas-guiding means 20 shown in FIG. 4 is a chamber-shaped body, which consists of the outer arcuated portion 20a, inner flat portion 20b and side portion 20c, which are connected to form a chamber. The sucking ports 21 are apertures through this portion 20b and are arranged vertically. Since the reaction gas is guided through the chamber, its mixing with the gas in the furnace interior and its diffusion into the furnace interior are prevented.

Again referring to FIG. 2, the second gas-guiding means 20 is provided with two partition plates 20d extending along the gas-flowing direction. Since the flow distance of the reaction gas from the upper inter-wafer clearance is longer than that from the lower inter-wafer clearance, the flow resistance of the former reaction gas is greater than that of the latter reaction gas. The partition plate is, therefore, provided to increase the cross-sectional area of the flowing channel of the former reaction gas to greater than that of the latter reaction gas, and hence to relatively decrease the flow resistance of the former reaction gas. As a result, the sucking rates of the reaction gases from the upper and lower inter-wafer clearances are equalized. The above mentioned increase of cross-sectional area is realized by increasing the width of channels (the dimension shown in FIG. 2).

As is shown in the embodiment illustrated in FIGS. 2 and 4, the conduits 10a, 10b, 10c, of which the first gas-guiding means 10 consist, protrude through the annular partition plate 26. As shown in FIG. 4, the annular partition plate 26 is rigidly secured to the inner wall of the reaction tube 2 around the outer periphery thereof. The annular partition plate 26 faces at its inner periphery the outer annular portion 18a of the quartz boats 18 via a clearance 27 which is as small as possible but allows the rotation of the quarts boats 18.

In addition, the annular partition plates 26 are provided, as shown in FIG. 2, as much as the number of the wafers and are arranged vertically.

Figure 5:
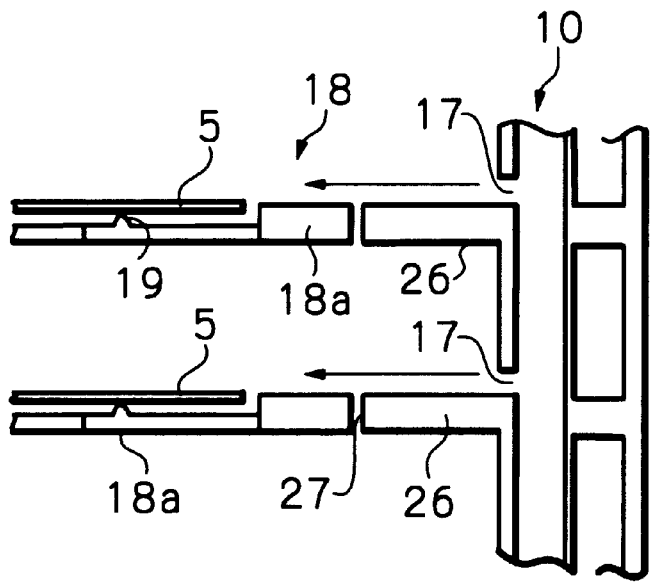
FIG. 5 is an enlarged view of the part C of FIG. 2.

Referring to FIG. 5, which is an enlarged view of the part C of FIG. 2, the first ports (discharging ports) 17 in the form of a gas-nozzle are formed on the wall of the first gas-guiding means 10. The reaction gas discharged from the first ports 5 flow, as indicated by the arrows, toward the second gas-guiding means (not shown). The gas streams shown by the arrows are brought into contact with wafers 5 below the respective gas streams and thus form a polycrystalline Si film and the like of a semiconductor device. These gas streams are also brought into contact with the lower side of the wafers 5 and form a thin polycrystalline Si film on the lower surface of the wafers 5, where no semiconductor device is produced.

A film formed on the lower surface of wafers can be thickened by means of using high pins 19. The reaction-gas flow on the upper surface of wafers is, therefore, liable to separate to flow on the lower surface. The distortion of wafers can, therefore, be made minimized by the gas-flow-sparation, because the difference in film thickness between the upper and lower films is made smaller. This method is advantageous for forming a thick film, for example, a 500 angstrom or more thick nitride film and a 5000 angstrom or more thick $SiO_2$ film.

The third and fourth gas-guiding means are essentially those to prevent mixing of the reaction-gas layer discharged from one of the discharging ports 17 with the reaction gas layers discharged from the neighboring discharging ports 17 above and below the above mentioned one. It is intended that the flow rate and distribution of the reaction gas on one of the wafers is virtually independent of those of the reaction gas on another wafer.

Figure 6:
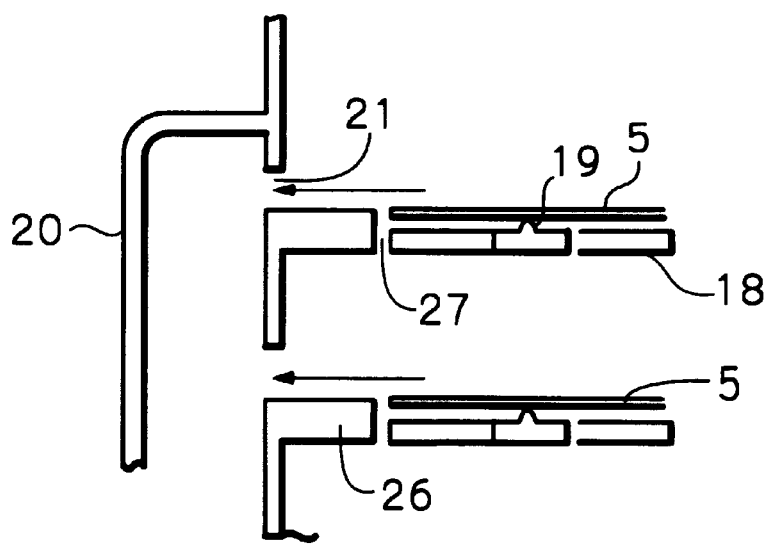
FIG. 6 is an enlarged view of the part D of FIG. 2.

Referring to FIG. 6, which is an enlarged view of the part D of FIG. 2, the reaction gas from the first gas-guiding means (not shown) is discharged toward the suction ports 21 of the second gas-guiding means 20. The annular partition plates 26 separate their upper and lower spaces from one another in front of the suction ports 21. In addition, the clearance 27 is narrowly formed. Therefore, the reaction gas, which has contributed to the formation of a film on one of the wafers, is essentially not mixed with the upper and lower layers of the reaction gas and is flowed into the suction ports 21.

Different kinds of reaction gas, such as silane, phosphine and diborane, can be flowed through the conduits 10a, 10b and 10c, respectively, of the first gas-guiding means. Alternatively, the same kind of reaction gas can be flowed through two or more of the conduits 10a, 10b and 10c. Preferably, the conduits 10a, 10b and 10c have an opening angle of from 30 to 40° as seen in the plane view, so that the reaction gases discharged from these conduits spread over the surface of wafers. Although the reaction gases spread, the concentration of reaction gases is locally low on the surface of the wafers. Therefore, the wafers are rotated in the present invention so as to equalize the growth rate of a film on the wafer surface.

Referring again to FIG. 2, a non-reactive gas such as $N_2$ or the like and an inert gas such as Ar or the like are fed in a small amount through the inflow-conduit 15 of the purge gas. The purge gas prevents the reaction gas in small amount from flowing into the lower part of the furnace and forming particles. If the purge gas is blown above through the clearances 27 (FIGS. 5 and 6) in a large amount, the flow of the reaction gas described above is disturbed. Therefore, the amount of purge gas should be kept to a very small amount and/or the purge gas should be exhausted from the conduit 15'.

Figure 7:
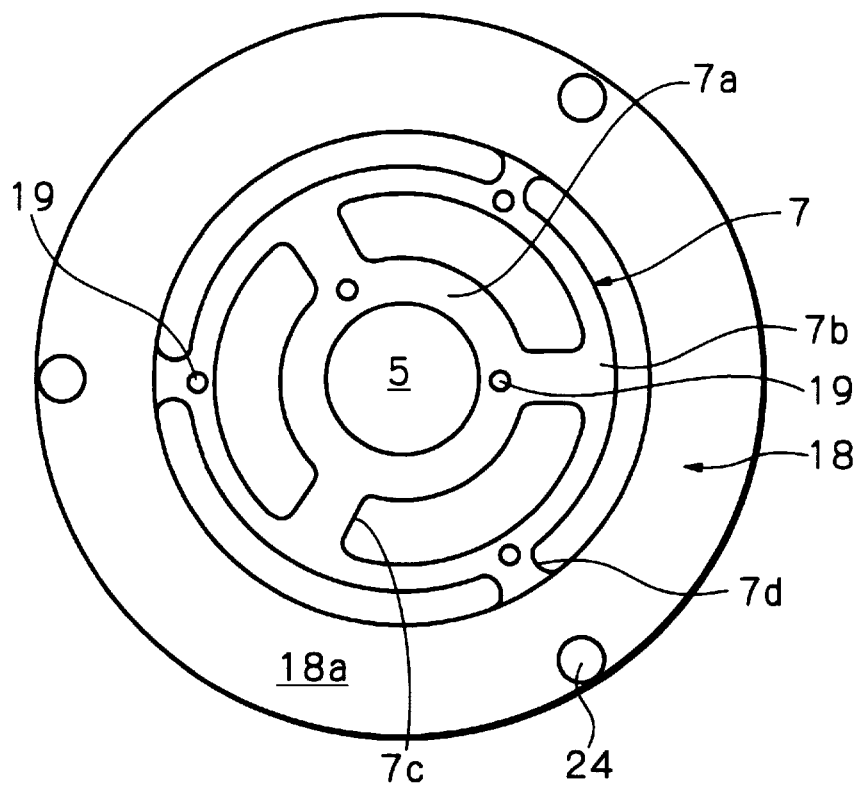
FIG. 7 is a plane view showing a boat and a wafer-holding jig.

Referring to FIG. 7, an embodiment of the wafer-holding jig according to the present invention is illustrated.

The wafer-holding jig comprises an inner annular portion 7a, an outer annular portion 7b and the radially extending and equally spaced first joint portions 7c which connect the inner and outer annular portions 7a and 7b, respectively, and which extend radially at an equal angle therebetween. An apropriate number of the pins 19 are distributed on the inner annular portion 7a and an outer annular portion 7b so as to support a wafer 5 from below by the point-contact system. Two or more inner annular portions 7a may be provided to support a large-diameter wafer.

The second joint portions 7d radially protrude from the outer annular portion 7b and are connected with the quartz boat 18a. These portions 7a, 7b, 7c, 7d are formed by punching or etching a monolithic sheet, such as a silicon wafer, to remove the unnecessary portions for forming the portions 7a, 7b, 7c, 7d. The quartz boats 18 are vertically arranged by and fixed to the columns 24. Since the wafers 5 are held on the outer peripheral portion (7b) and central portion (7a), the distortion of wafers is kept extremely small.

Referring to a plane view of FIG. 8, an embodiment of the wafer-loading and unloading means according to the present invention is illustrated. Since the conventional quartz boat is in the form of a horse-shoe or a fork, a wafer is loaded on the quartz board from the open portion of a wafer-holing jig. However, since the wafer-holding jig according to the present invention has an annular holding structure as shown in FIG. 7, if a conventional loading jig is used, there occurs interference between a loading jig and the quartz boat 18 and between a loading jig and the wafer-holding jig 7. The wafer-loading and unloading jig 50 shown in FIG. 8 basically consists of the upper fork-shaped portion 51, which horizontally advances and retracts above the quartz boat 18 and the wafer-holding jig 7, and the lower portion 52 which horizontally advances and retracts below the wafer-holding jig 7 and the quartz boat 18. The lower portion 52 lifts the wafer and the upper fork-shaped portion 51 supports the lifted wafer from below and retracts to unload the wafer. When the wafer is loaded, the opposite sequence is carried out. That is, a wafer is supported by the upper fork-shaped portion 51 and is advanced to a predetermined position. The lower portion 51 is advanced to this predetermined position and is then lifted to support the wafer from below. The upper portion 52 is then lowered to place the wafer on the wafer-supporting jig 7. A circular recess 51c having a slightly smaller diameter than the diameter of wafer is formed on the upper fork-shaped portion 51 so as to stabilize the held position of a wafer.

Referring to FIG. 9, the wafer-lifting in the sequential movements of the wafer-loading and unloading means is illustrated. One of the wafers 5 is lifted by the protruding portion 52a of the lower portion 52. The height of the protruding portion 52a is less than the distance between the upper and lower wafer-holding jigs 7 and is greater than the height of the quartz tube 18. The diameter of the protruding portion 52a is smaller than the inner annular portion 7a but is not so small as to destabilize the wafer.

Figure 10:
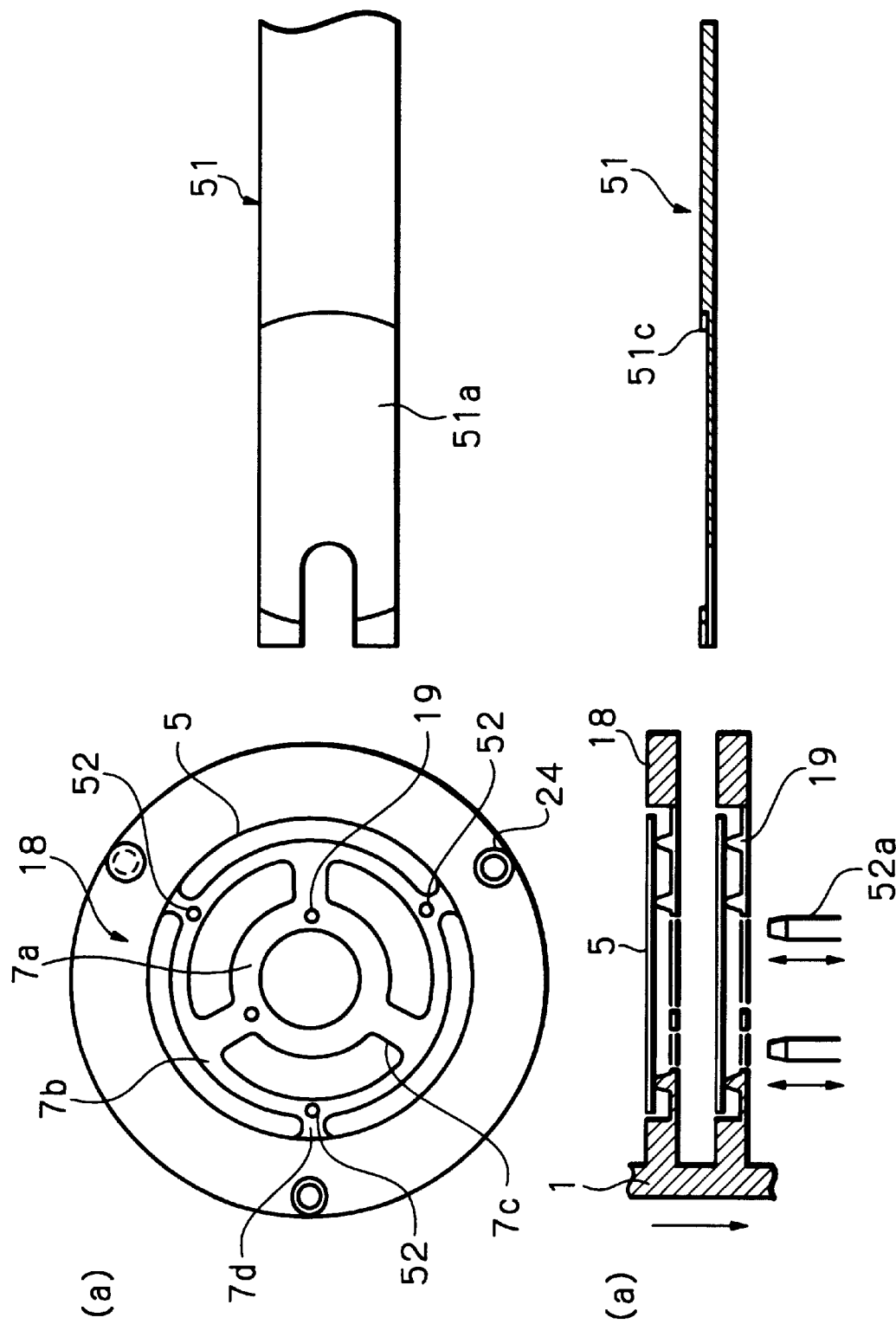
FIGS. 10(a) and (b) are plane view and side view of the wafer-loading and unloading jig according to another embodiment.

Referring to FIG. 10 another embodiment of the wafer-loading and unloading means is illustrated. In this embodiment the wafers are not lifted by the lower portion 52 (FIG. 9) but are lifted by the three supporting rods 52a which can be vertically displaced and protruded through the removal portions of the wafer-holding jig 7. In the loading period, the upper and then lower wafers 5 are successively loaded on the wafer-holding jig 7, while in the unloading period, the lower and then upper wafers 5 are successively unloaded from the wafer-holding jig 7. The upper fork-shaped portion 51 is used as in the embodiment of FIG. 8.

More preferred embodiments of the apparatus according to the present invention are now described.

When a single tube is used for the first gas-guiding means, the flow rate of discharged reaction gas from the discharging ports positioned more close to the front end thereof becomes smaller. In order to avoid such disadvantage, the diameter of discharging ports should be greater or the inner diameter of the conduit should be smaller as the position is closer to the front end thereof. However, it is difficult to attain exact control of the flow rate. Therefore, according to a preferred embodiment, the first gas-guiding means comprises a section, where the reaction gas flows upward, and a section, where the reaction gas flows downward, and these sections are arranged in parallel. It is intended in this embodiment to equalize the flow rate of the reaction gas from every discharging port. A common gas source may be used to all of these portion, or these portions may be provided with separate gas sources.

Figure 11:
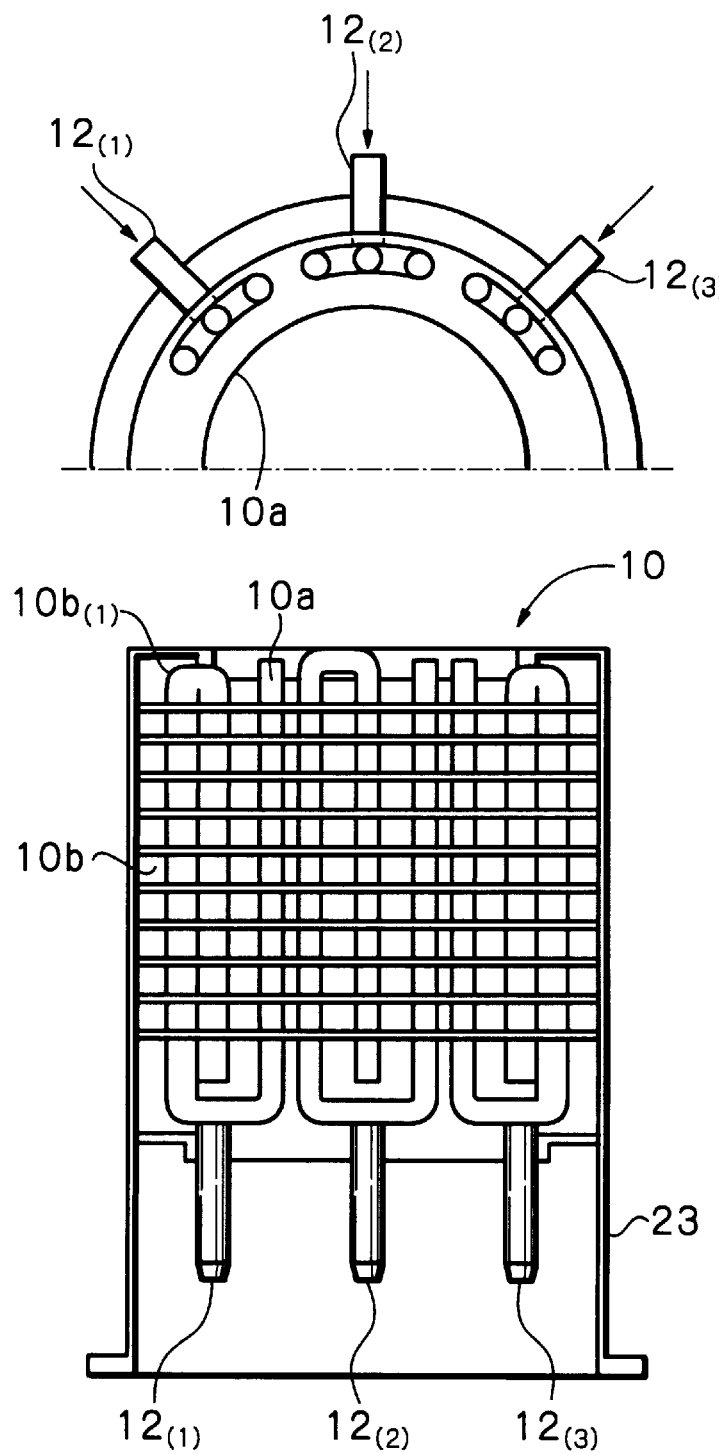
FIG. 11 shows an embodiment of the first gas-guiding means.

More specifically as shown in FIG. 11 (the discharging ports are not shown), the main conduits 12(1), (2), (3) are branched into two conduits 10a and 10b. The conduit 10a extends upward, while the conduit 10b once extends upward and then changes its direction by 180° to extend downward $10b_{(1)}$. The discharging ports are formed on the upper extension $10a$ and the downward extension $10b_{(1)}$. The number of discharging ports formed at each of the extensions $10a$ and $10b_{(1)}$ is the same as the number of the inter-wafer clearances.

The temperature-elevating and lowering methods are hereinafter described with reference to FIG. 12.

The heating or cooling gas is fed from the gas source (not shown) into the gas-circulating system 60 by opening the valve 58a. Reactive impurity gases, such as $H_2O$ are removed in the refining device 61, and then stored once in the storage tank 62. In the case of the temperature-elevation, while the valve 58c is being closed, the heating gas is heated in the gas heater 63 and is further heated by the ribbon heater mounted in the cover 64 surrounding the gas conduit. The so-heated heating gas is then fed into the reaction tube 2. In the case of cooling, the valve 58b is closed and the valve 58c is opened, the cooling gas is fed into the reaction tube 2 via the conduit surrounded by the heat-insulating cover 65.

Figure 12:
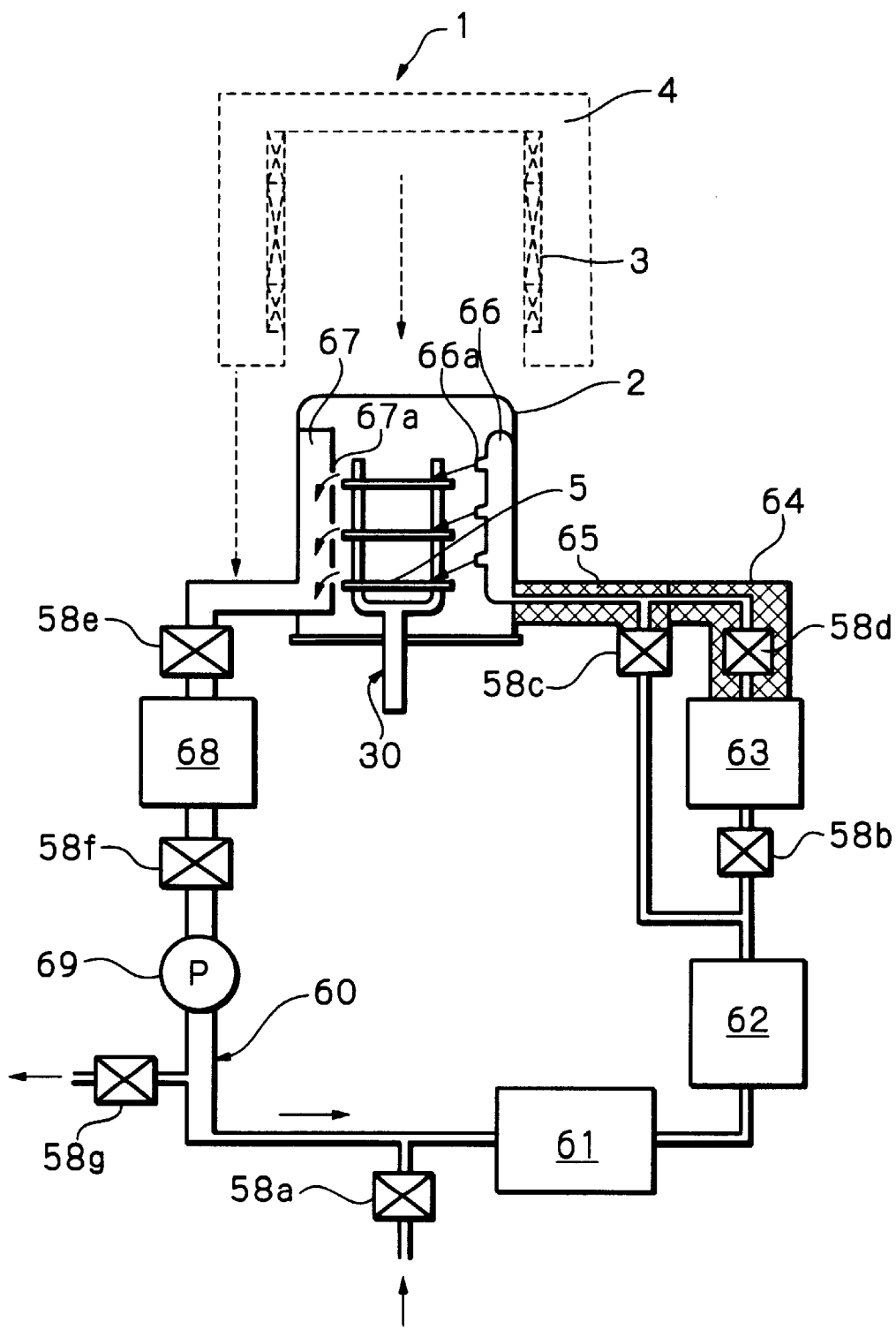
FIG. 12 shows an embodiment of the apparatus for implementing the temperature-elevating method according to the present invention.

According to the temperature-elevating method illustrated in FIG. 12, three variations are possible. One of them is a method whereby the temperature is elevated to a predetermined one without heating by the heater 3 as shown in FIG. 12. This method can be applied when the reaction temperature is from 400 to 500° C. The second method is the above mentioned method followed by lowering the furnace body 4 and heating by the heater 3. According to the third method, the furnace body 4 is lowered to surround the reaction tube 2, and the heating by both heater 3 and heating gas is carried out. In the third method, the heating gas is evidently heated by the heater 3.

The conduit, of which the gas-circulating system 60 is comprised, is a dead end in the reaction tube 3. The discharging conduit 66 is extended along the inner wall of reaction tube 2 and is constructed to discharge the heating gas from the discharging ports 66a, the number of which is the same as that of the wafers 5. The discharging ports 66a protrude downward slantwise through the side wall of the discharging conduit 66. The heating gas is, therefore, discharged toward the upper surface of the wafers 5. The wafers 5 are held at a predetermined position and rotated around the central axis thereof by means of the vertical wafer-conveying mechanism 30. When the distance between the wafers is small, the heating gas may be horizontally discharged as shown in FIGS. 2, 5 and 6. Preferable flow rate of the heating gas is in a range of from 1.0 to 3.0 L/minute/wafer in the case of a 12 inch wafer.

The heating gas, which has undergone the heat exchange with the wafers 5 and thus the temperature-drop, is preferably exhausted as rapidly as possible. Another conduit, of which the gas-circulating system is comprised, is a dead end end in the reaction tube 3 and is constructed as a discharging conduit 67 extending along the inner wall of reaction tube 2. The sucking ports 67a protrude through the side wall of the sucking conduit 67 and face the discharging ports 66a. The sucking ports 67a are positioned slightly below the discharging conduit 66 and are located at a level directly above the level of the wafer surfaces. In addition, the exhausting blower 69 is connected to an extension of the discharging conduit 67a to generate approximately $-10$ mm $H_2O$ of the difference pressure.

The heating gas, which has spread on the wafer surface and has undergone the heat exchange, is, therefore, horizontally sucked from the sucking ports 67a but substantially does not flow vertically in the reaction tube 2. In addition, since the above mentioned reaction gas does not stagnate in but is exhausted out of the reaction tube 2, the function of heating gas, which is successively discharged from the discharging ports 66a, is not impeded. The heat exchange between the wafers and the heating gas is, therefore, promoted, while the heat exchange between the discharged and stagnating gases is suppressed.

The sucked and then collected heating gas is cooled by the radiator 68 to a temperature appropriate for refining, and is, subsequently, refined by the refining device 61 and is reused.

Upon the temperature-elevation up to a predetermined temperature by the method as described above, the following methods are carried out.

(a) The feeding of heating gas is immediately stopped and the reaction gas is fed through the first gas-guiding means. This may be the discharging conduit 66. Such reaction as CVD, oxidation, nitriding and the like are thus carried out.

(b) The conventional method of heat-elevating is carried out up to the reaction temperature.

(c) While the feeding of heating gas is continued or stopped, the heating is carried out to anneal the wafers.

After the methods (a), (b) and (c), the cooling is carried out. The cooling method according to the present invention is now described.

When the furnace body 4 is vertically displacable, it is preferably lifted and stationarily held at the position indicated by the dotted lines. The valves 58b and 58d are closed, and the valve 58c is opened so as to discharge the cooling gas having room temperature into the reaction tube 2. Since the temperature of the discharged cooling gas is lower than the temperature of wafers 5, for example 400° C., the heat exchange between the cooling gas and the wafers 5 occurs, and the heat is withdrawn from the wafers. After that, the cooling gas is sucked from the sucking ports 67a. The sucked and recovered gas is cooled by the radiator 68. The cooled gas is reused or may be exhausted out of the conduit.

When the CVD of a polycrystalline silicon film is carried out by the method of the present invention, the growth rate is in the range of from 300 to 2000 angstroms/minute and the thickness variance on each wafer is within a range of 2 to 5%.

When the CVD of an HTO film is carried out by the method of the present invention, the growth rate is in the range of from 30 to 150 angstroms/minute and the thickness variance on each 8 inch wafer is within a range of 1 to 4%. It would be understood from the descriptions hereinabove that fhe growth rate of various films can be enhanced by the method according to the present invention.

What is claimed is:

1. A method for producing a semiconductor device, in a heating furnace, in which a reaction tube is installed and a temperature-equalizing zone is formed in the reaction tube, comprising the steps of:

locating semiconductor-silicon wafers in the temperature-equalizing zone in a vertical stack so that their like surfaces are parallel to one another and are face to face, setting distances of clearances between said wafers to approximately 5 mm or more;

rotating said semiconductor-silicon wafers around an axis perpendicular to the wafer surface; and, introducing a reaction gas into said clearances by discharging essentially all of the reaction gas from discharging ports of a first gas-guiding means, said discharging ports located at a first position in the proximity of edges of the semiconductor-silicon wafers, said dischaging ports facing said clearances.

2. A method according to claim 1, wherein the number of the semiconductor-silicon wafers is approximately seventy five or fewer.

3. A method according to claim 2, further comprising a step of sucking essentially all of the reaction gas from the clearances between the semiconductor-silicon wafers into suction ports of a second gas-guiding means located at a second position on an opposite side of the edges of the wafers.

4. A method according to claim 3, further comprising the steps of:
guiding the reaction gas to said first position while impeding contact of the guided reaction gas with gas in the furnace interior.

5. A method according to claim 4, wherein the flow rate of the reaction gas discharged through the discharging ports is essentially the same as one another.

6. A method according to claim 3, further comprising the steps of:
guiding the reaction gas to said first position while impeding contact of the guided reaction gas with gas in the furnace interior;
sucking the reaction gas from the clearances between the semiconductor-silicon wafers by the second gas-guiding means having sucking ports such that the reaction gas from each of the clearances between the semiconductor-silicon wafers flows into a particular sucking port; and,
guiding the reaction gas through the second gas-guiding means while impeding contact with the gas in the furnace.

7. A method according to claim 6, wherein the flow rate of the reaction gas discharged through the respective discharging ports are essentially the same.

8. A method according to claim 5 or 7, wherein the first gas-guiding means comprises a first section, in which the reaction gas flows upward, and a second section, in which the reaction gas flows downward, and, further the first and second sections are arranged in parallel.

9. A method according to claim 8, wherein the first and second sections are connected to form one zigzag channel.

10. A method according to claim 3 or 6, wherein the suction ports of the second gas-guiding means are wider than the discharging ports of the first gas-guiding means.

11. A method according to claim 1, 2, 3, 4, 5, 6 or 7, said method further comprising the steps of:
elevating temperature of said semiconductor-silicon wafers up to a reaction temperature; and
discharging a second gas, which is essentially non-reactive with the semiconductor-silicon wafers and which has higher temperature than the semiconductor-silicon wafers, from a position in the proximity of the edges of the semiconductor-silicon wafers toward each semiconductor-silicon wafer, until the temperature of the semiconductor-silicon wafer is elevated up to 800° C. at the highest.

12. A method according to claim 1, 2, 3, 4, 5, 6 or 7, said method further comprises the steps of:
elevating temperature of said semiconductor-silicon wafers up to a reaction temperature; and
discharging a second gas, which is essentially non-reactive with the semiconductor-silicon wafers and which has lower temperature than the semiconductor-silicon wafers, from a position in the proximity of the edges of the semiconductor-silicon wafers toward each semiconductor-silicon wafer, until the temperature of the semiconductor-silicon wafer is 800° C. at the highest.

13. A method according to claim 1 or 2, further comprising the steps of supporting the semiconductor-silicon wafers locally from below and exposing non-supported lower surfaces of the semiconductor-silicon wafers to the reaction gas, thereby forming the film on both the upper and lower surfaces of the semiconductor-silicon wafers.

14. A method according to claim 13, further comprising the step of: inflowing a purge gas consisting of non-reactive gas or inert gas into the reaction tube from below.

* * * * *